United States Patent [19]
Lenz

[11] Patent Number: 5,546,299
[45] Date of Patent: Aug. 13, 1996

[54] POWER SUPPLY FOR PREDOMINANTLY INDUCTIVE LOADS

[75] Inventor: Helmut Lenz, Oberasbach, Germany

[73] Assignee: Siemens Aktiengesellschaft, Munich, Germany

[21] Appl. No.: 196,544

[22] Filed: Feb. 15, 1994

[30] Foreign Application Priority Data

Feb. 15, 1993 [DE] Germany ........................... 43 04 517.0

[51] Int. Cl.$^6$ .................................................. H02M 7/00
[52] U.S. Cl. .............................................. 363/71; 363/65
[58] Field of Search .................................. 363/65, 71, 72, 363/20, 21; 307/44, 58, 82

[56] References Cited

U.S. PATENT DOCUMENTS

| | | | |
|---|---|---|---|
| 4,437,053 | 3/1984 | Bax | 323/268 |
| 4,916,395 | 4/1990 | Usui | 324/307 |
| 5,006,914 | 11/1991 | Vavrek et al. | 324/309 |
| 5,057,765 | 10/1991 | Clark et al. | 323/288 |
| 5,122,945 | 1/1992 | Marawi | 363/21 |
| 5,229,930 | 7/1993 | Makimaa | 363/132 |
| 5,418,706 | 5/1995 | Havas et al. | 363/57 |

FOREIGN PATENT DOCUMENTS

| | | |
|---|---|---|
| 0227411 | 7/1987 | European Pat. Off. . |
| 4017207 | 12/1991 | Germany . |
| 907522 | 2/1982 | U.S.S.R. . |
| 960773 | 9/1982 | U.S.S.R. . |
| 957189 | 9/1982 | U.S.S.R. . |
| 997009 | 2/1983 | U.S.S.R. . |

OTHER PUBLICATIONS

"Mittenspannungsstabilisierte Dualstromversorgung." D+e, uml +ee ring et al., Radio Fernsehen Elektronik, vol. 31, No. 2 (1982), p. 89.

"Entwicklung einer Doppel–Netzsteckkarte," Schulz, Elektronik Praxis, vol. 7, No. 1/2 (1992), pp. 29–34.

"Schutz von Motor–Treiber–Bausteinen," Maiocchi et al., Elektronik, vol. 17 (Aug. 17, 1990), pp. 98–102.

"A General Purpose Non–Resonant Gradient Power System," Mueller et al., Book of Abstracts, vol. 1, Society of Magnetic Resonance in Medicine, Tenth Annual Scientific Meeting and Exhibition, Aug. 10–16, 1991.

*Primary Examiner*—Matthew V. Nguyen
*Attorney, Agent, or Firm*—Hill, Steadman & Simpson

[57] ABSTRACT

A power supply for predominantly inductive loads includes at least two controllable voltage sources, each of which has a voltage-setting unit connected at its input side to a d.c. voltage source, and which delivers a controlled output voltage at its output terminals. The d.c. voltage sources respectively connected to the voltage-setting units are separated in potential, and the output terminals of the voltage-setting units are connected in series. A first of the controllable voltage sources is fashioned for basic load operation for supplying a basic output voltage, and at least a second of the controllable voltage sources is fashioned for peak load operation for supplying peak output voltages which exceed the basic output voltage.

18 Claims, 7 Drawing Sheets

POWER SUPPLY FOR PREDOMINANTLY INDUCTIVE LOADS

BACKGROUND OF THE INVENTION

1. Field of the Invention

The present invention is directed to a power supply for predominantly inductive loads of the type having at least two controllable voltage sources, each of which includes a voltage-setting unit connected at its input side to a d.c. voltage source and which generates a controlled voltage output at its output terminals, and wherein the d.c. voltage sources respectively connected to the voltage-setting units are separated in potential, with the output terminals of the voltage-setting units being connected in series.

2. Description of the Prior Art

It is necessary for rapid, two-dimensional imaging in a medical nuclear magnetic resonance imaging apparatus to superimpose various magnetic gradient fields on a fundamental magnetic field in rapid succession. For example, the operational sign of a read-out gradient in such an apparatus is changed in alternation in succession in an imaging technique known as echo-planar-imaging (EPI).

One possibility for achieving such rapid changes in current, required for changing the operational sign, is to operate a resonant circuit composed of a capacitor and a gradient coil at its resonant frequency, this resonant frequency typically lying in the kilohertz range. Arbitrary pulse shapes of the read-out gradients, however, are not possible using this approach, but instead only sinusoidal pulse shapes can be produced. The echo signal which is thereby obtained must then be appropriately sampled and filtered. In addition, transient effects can deteriorate the signal which has been read out.

A power supply for feeding gradient coils of a magnetic resonance imaging apparatus, i.e., for feeding a predominantly inductive load, is described in the article "A General Purpose Non-Resonant Gradient Power System," Mueller et al., Book of Abstracts, Vol. 1, Society of Magnetic Resonance in Medicine, Tenth Annual Scientific Meeting and Exhibition, Aug. 10–16, 1991. This known power supply offers the possibility of achieving the rapid changes in current required for changing the operational sign of the gradient fields by employing a high-voltage source which is connected to the gradient coil as needed, which is arranged in parallel with a linear gradient amplifier. Although it thus possible to supply currents having a substantially rectangular waveform, with steep edges, to the gradient coil using this approach, the rise in the current is essentially unregulated, and is dependent on the ohmic resistance of the coil, its inductance, and on the voltage of the high-voltage power pack.

German OS 40 17 207 discloses a power supply of the general type initially described, which is employed in the fields of electrical discharge machining, cathode sputtering of metals, or exciting lasers for processing materials. Step-down regulators are used as the voltage-setting units, which are respectively supplied with offset clock pulses which control the operation thereof. Due to the higher ripple of the output voltage caused as a result, the inductance of the smoothing choke can be reduced compared to the value which is otherwise standard. The connected users can therefore be supplied with a rapidly varying direct current. The power supply disclosed in this reference, however, can only supply direct currents in one direction. All series-connected, controlled voltage sources, however, are active given low output voltages, i.e. only small changes in current given predominantly inductive loads, even using a lower drive (modulation) of the voltage-setting unit. For applications wherein high voltages are only briefly required, this results in correspondingly high switching losses.

SUMMARY OF THE INVENTION

It is an object of the present invention to provide a power supply which can deliver pulse-shaped, high output currents with a steep, regulated pulse rise. Since a rapid rise in current, given predominantly inductive loads, requires that the power supply deliver high, regulatable voltages, it is a further object of the present invention to minimize the switching losses in the voltage-setting units which are employed in the power supply, when peak voltages are only briefly required.

The above object is achieved in accordance with the principles of the present invention in a power supply having a first, controllable voltage source which is fashioned for basic load operation for delivering a basic output voltage, and at least one further, controllable voltage source is fashioned for peak load operation for supplying peak output voltages which exceed the basic output voltage. The losses in the respective voltage-setting units are thus maintained particularly low because peak voltages are only briefly required and therefore the voltage source for peak load operation normally merely permits current to pass through it and exhibits only ohmic losses and on-state losses, respectively, in components such as diodes and switching elements, and when the voltage source for peak load operation is briefly activated during peak load conditions, only losses due to repeated on-off switching additionally arise.

For generating higher output voltages, at least one additional controllable voltage source for peak load operation is provided in a further embodiment of the invention, so that at least two voltage sources for peak load operation are present. These at least two voltage sources, in combination, provide for graduated delivery of the peak output voltages. The losses in the individual voltage sources are maintained low due to the graduated delivery of the peak output voltages.

In another embodiment, again, an additional controllable voltage source for peak load operation is provided, however in this embodiment the at least two voltage sources for peak load operation supply essentially equal parts of the peak output voltage. A good synchronization of the voltage sources used for peak load operation is ensured, however, somewhat higher losses must be tolerated as a result.

In the embodiment wherein two voltage sources are used which supply substantially equal parts of the peak output voltage, the voltage-setting units of these two voltage sources are operated in switched mode, so as to influence the peak output voltages by means of a pulse-width modulation, the switching of the two voltage-setting units taking place by means of control (clock) pulses respectively supplied to the two units which are chronologically offset. Although graduated delivery of the output voltage cannot be obtained in this embodiment, the use of the chronologically offset switching signals increases the switching frequency for the overall output voltage, thereby resulting in an output voltage ripple which, like the current ripple, is less than when chronologically coincident switching of the voltage sources takes place.

For generating steep positive and negative edges of the current pulses, each voltage-setting unit has two branches which are connected in parallel with the d.c. voltage source supplying the voltage-setting unit, each branch in turn being composed of two series-connected final control elements, with the output terminals being arranged between the final control elements of each branch.

The final control elements may be fashioned for switched mode operation, by means of which the output voltage is controllable with a pulse-width modulation. The switched mode operation enables a low-loss control of the output voltage. High control dynamics are assured given an adequately high switching frequency, in which case the current ripple of the output current is also negligibly slight.

In a further embodiment wherein the voltage-setting unit is operated in a switched mode, a modulator is allocated to the voltage source for peak load operation for effecting the pulse-width modulation, and an offset stage precedes the modulator. The offset stage charges a regulator output signal with at least one chronologically constant signal. The offset stage thus results in the voltage source for peak load operation being modulated modulates when the modulation limits of the voltage source for basic load operation have been reached.

In a further embodiment, the modulator is provided with an amplifier for matching the regulator output signal. It is thus possible to linearize the characteristic of the power supply, this characteristic being composed of the characteristics of the individual voltage sources.

In another embodiment, the gain of the matching amplifiers can be halved in the proximity of the modulation limits of the modulators. This measure also serves to further linearize the characteristic of the power supply.

In order to avoid unwanted charging of the d.c. voltage sources due to an asymmetrical modulation, a first discharge element can be connected in parallel with the d.c. voltage sources.

A second discharge element can also be provided for avoiding charging of the d.c. voltage sources, as well as for reducing any non-linearities produced by the on-state voltage, arising because of the drive of the final control elements. This arrangement has the advantage that losses only arise in the discharge element when the voltage source to which it connected supplies an output voltage.

The power supply disclosed herein is especially suitable for supplying currents to a gradient coil in a nuclear magnetic resonance imaging apparatus for generating gradient magnetic fields.

DESCRIPTION OF THE PREFERRED EMBODIMENTS

Figure 1:
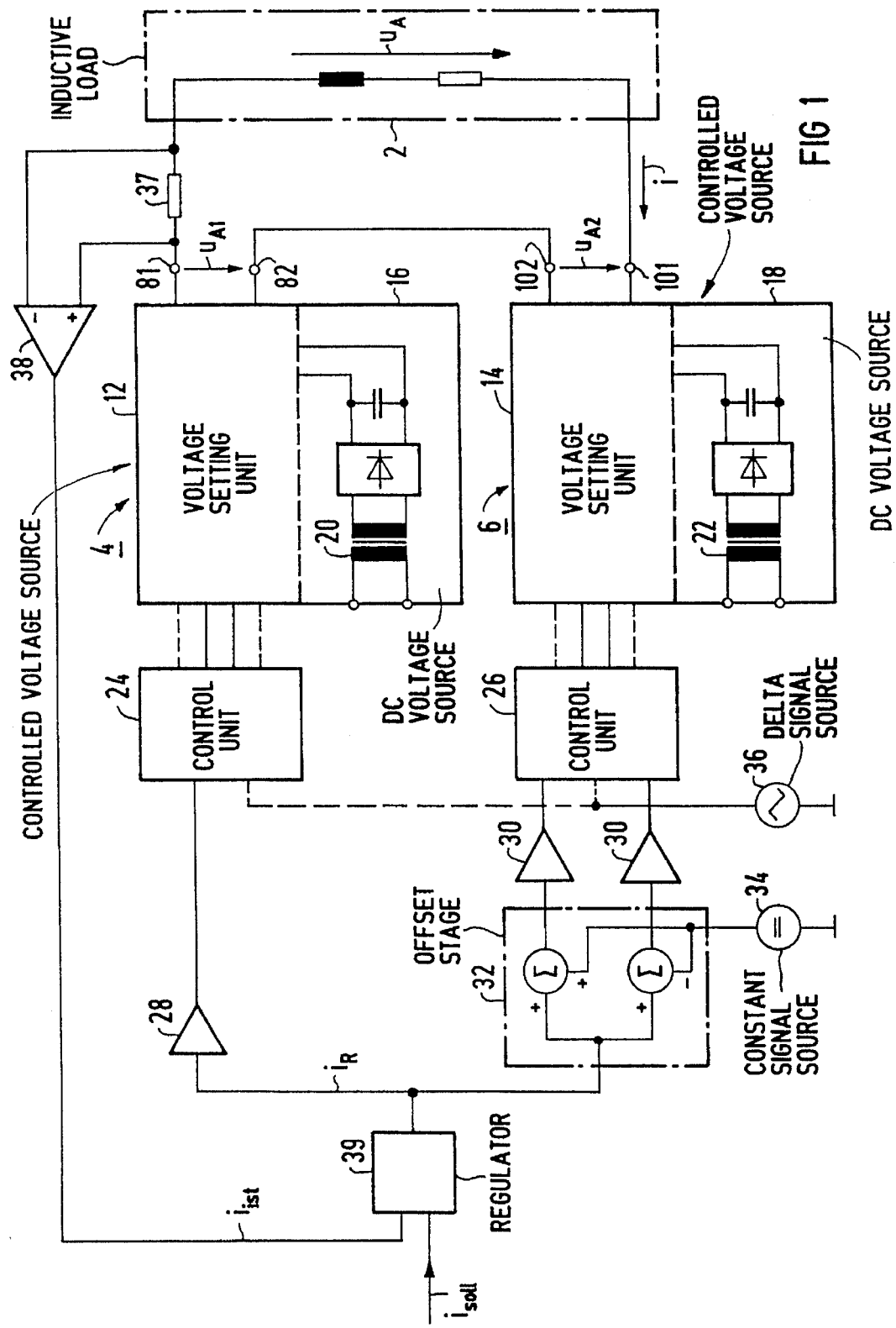
FIG. 1 is a schematic block diagram of a power supply having a series circuit including a controlled voltage source for basic load operation and a controlled voltage source for peak load operation, constructed in accordance with the principles of the present invention.

The block circuit diagram shown in FIG. 1 illustrates the basic components of a power supply constructed in accordance with the principles of the present invention for a predominantly inductive load 2. It is desired that high, pulse-shaped currents i having steep edges should flow in the inductive load 2. The amplitudes of these currents are approximately 250 A, whereas the voltages required for rapid changes in the current are on the order of magnitude of up to 2 kV. Such demands are made on power supplies for gradient coils in a nuclear magnetic resonance imaging apparatus, when the imaging apparatus is intended to produce tomograms within the shortest possible time. An additional demand is that the rise in the current and the drop in the current must be regulated in order to be independent of load and voltage fluctuations. It is also required that the regulation to a desired value should ensue without significant transience.

The predominantly inductive load 2 may, for example, be a gradient coil of a nuclear magnetic resonance imaging apparatus.

The power supply shown in FIG. 1 includes controlled voltage sources 4 and 6 which generate respective output voltages $u_{A1}$ and $u_{A2}$ at their output terminals 81 and 82, and 101 and 102. These output voltages define the total voltage $u_A$ at the load 2 when added.

The individual voltage sources 4 and 6 respectively include voltage-setting units 12 and 14 and d.c. voltage sources 16 and 18 connected to the voltage-setting units 12 and 14. The d.c. voltage sources 16 and 18 respectively generate the input voltages for the voltage-setting units 12 and 14 from an alternating voltage. Separation of the potential of the d.c. voltage sources 16 and 18 from each other is achieved by isolating transformers 20 and 22 at the a.c. voltage side.

The control signals required for the voltage-setting units 12 and 14 are generated by respective control units 24 and 26 from an edited regulator output signal $i_R$. For that purpose, the regulator output signal $i_R$ is amplified via amplifiers 28 and 30, as described below with reference to FIGS. 8 through 12.

The controlled voltage source 4 is provided, first, for supplying the ohmic voltage component to the load 2 and, second, for supplying the inductive voltage component for slow changes in current. This means that the voltage source 4 is fashioned for basic load operation for supplying a basic output voltage. By contrast, the controlled voltage source 6 is fashioned for peak load operation for supplying peak output voltages which exceed the basic output voltage. This means that the voltage source 6 is activated only when the voltage source 4, by itself, can no longer supply the voltage required for a change in current.

In order to assure the aforementioned peak load operation, the signal $i_R$ is edited by an offset stage 32 and is supplied to the amplifiers 30. In the offset stage 32, a constant signal 34 (symbolized in FIG. 1 by a d.c. voltage source) is added to the regulator output signal $i_R$, so that the control unit 26 only supplies controls signals for generating the output voltage $u_{A2}$ which differ from zero when the regulator output signal $i_R$ upwardly or downwardly exceeds a predetermined value. When the output voltage $u_{A2}$ is to be zero, the voltage-setting unit 14 is switched to unimpeded current passage for the load current i.

The controlled voltage source 4 fashioned for basic load operation can be operated in a linear or analog mode, i.e., the output voltage $u_{A1}$ will be a linear function of the regulator output voltage $i_R$ edited by the amplifier 28 in the ideal case. The control unit 24 is then fashioned as a driver circuit, which must supply two drive signals. The connections indicated with dashed lines between the control unit 24 and the voltage-setting unit 12 are to be additionally provided when the voltage-setting unit 12 is fashioned for switched operation.

The voltage source 6 provided for peak load operation is fashioned for switched mode operation in a first embodiment. The output voltage $u_{A2}$ is generated by means of pulse-width modulation from the d.c. voltage generated by the d.c. voltage source 18. The control unit 26 is thus fashioned as a modulator, which defines the on-time of the final control elements arranged in the voltage-setting unit 14 by comparing a periodic delta signal 36 to the edited regulator output signal $i_R$. The connection indicated by dashed lines for supplying the periodic delta signal 36 to the control unit 24 can be provided in the embodiment wherein the voltage source 4 is also fashioned for switched operation, so that the control unit 24 can also generate its output voltage $u_{A1}$ by means of pulse-width modulation. The connections indicated by dashed lines between the control unit 26 and voltage-setting unit 14, as well as between the control unit 26 and the periodic delta signal 36, are not present in the embodiment wherein the voltage source 6 operates linearly. In this case, the control unit 26 is fashioned as a driver circuit, and must then supply only two drive signals.

Because the electronic circuits are referred to a reference signal potential in the normal case, the control signals must be supplied floating, at least to the voltage-setting unit 14. The separation of potential can ensue by means of optocouplers, light guides, pulsed transformers or isolating amplifiers.

The current rise and current drop of the output current i can be regulated.

A plurality of voltage sources which equally contribute to supplying the peak output voltage, operated in switched mode, can be connected in series, in which case the drive of the voltage sources 4 and 6 can ensue simultaneously, or with a chronological offset. Given simultaneous drive of the voltage sources 4 and 6, a good synchronization is achieved, because only one modulator is required for all of the control units corresponding to the control unit 26 for the respective voltage sources contributing to the peak output voltage. Given a chronologically offset drive, a modulator is required for each voltage source 6, but the ripple of the overall output voltage $u_A$ is thereby reduced.

Figure 2:
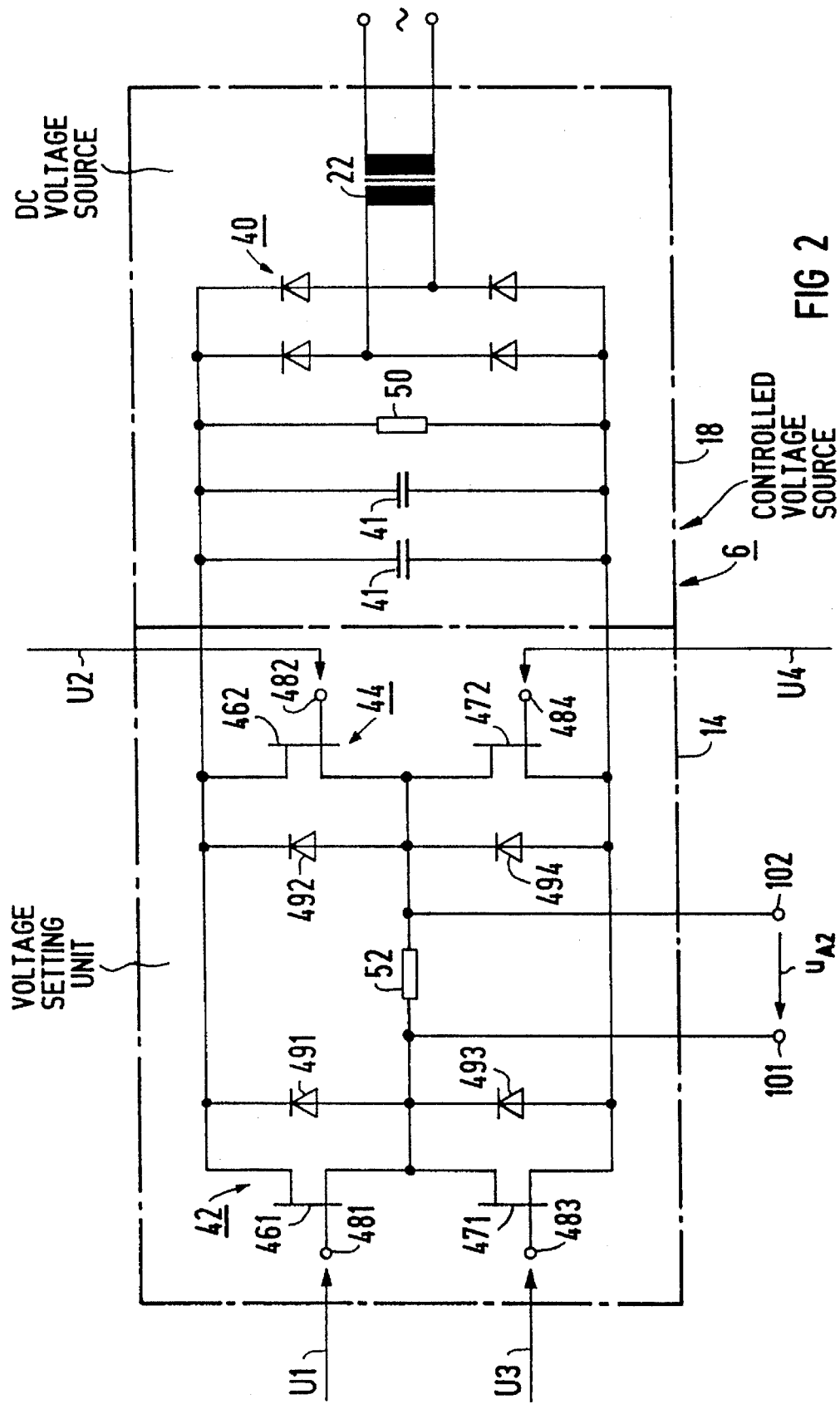
FIG. 2 is a circuit schematic for the voltage source of FIG. 1 for switched mode operation.

FIG. 2 shows a circuit for a controlled voltage source operating in switched mode, used as source 4 or 6. The following description shows the use as voltage source 6. As already shown in FIG. 1, the d.c. voltage source 18 has an isolating transformer 22 and a bridge amplifier 40, which acts on charging capacitors 41.

The voltage-setting unit 14 includes two branches 42 and 44 connected in parallel, each of which includes series-connected final control elements 461 and 471, or 462 and 472. The control elements 461, 462, 471 and 472 can be MOS field effect transistors, or insulated gate bipolar transistors connected in parallel, to which respective control signals U1, U2, U3 and U4 are supplied. The control signals U1, U2, U3 and U4 control the on and off states of the respective control elements 461, 462, 471 and 472. The control signals are supplied at respective control terminals 481, 482, 483 and 484. Free-running diodes 491, 492, 493 and 494 are respectively connected in parallel with the control elements 461, 462, 471 and 472. An output terminal 101 is connected at the junction of the control elements 461 and 471, and an output terminal 102 is connected at the junction of the control elements 462 and. The amplitude of the output voltage $u_{A2}$ across the terminals 101 and 102 is defined by pulse-width modulation, with the switching cycles being selected so short that the required control dynamics can be achieved.

A first discharge element 50 is connected in parallel with the d.c. voltage source 18, and a second discharge means 52 is connected in parallel with the output terminals 101 and 102. The function of the discharge elements is described in detail below.

Figure 3:
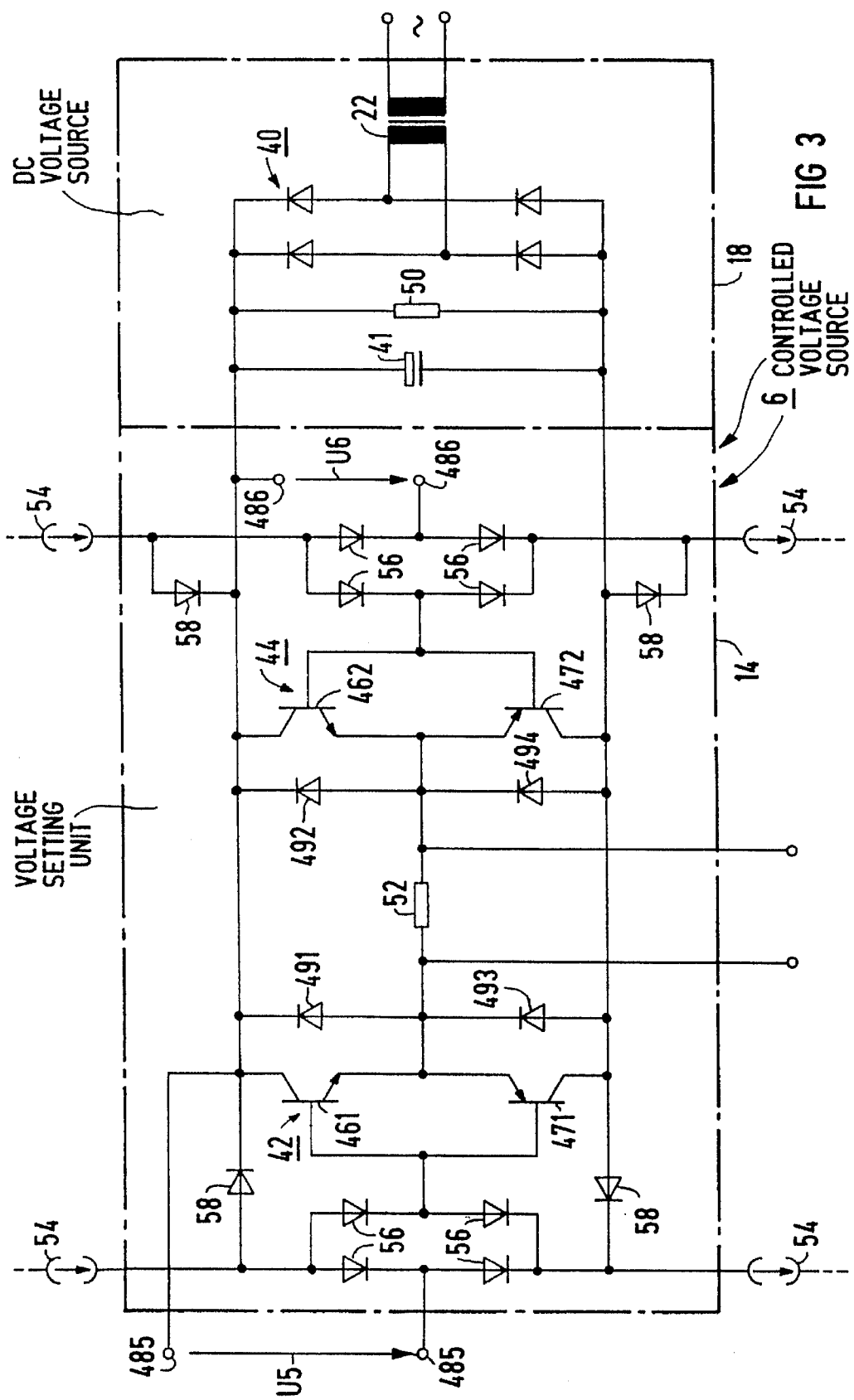
FIG. 3 is a circuit schematic for the voltage source of FIG. 1 for linear operation.

The controlled voltage source shown in FIG. 3 operates in a linear mode. The linearly operating voltage source shown in FIG. 3 can be used either as the voltage source 4 for basic load operation or as the voltage source 6 for peak load operation. The following description proceeds on the basis of utilization of the voltage source for peak load operation.

The d.c. voltage generation by the d.c. voltage source 18 ensues in the same way as described with respect to FIG. 2. The voltage-setting unit 14 again includes two parallel branches 42 and 44, each including two series-connected final control elements 461 and 471, and 462 and 472, which are shown as bipolar transistors. The control elements 461 and 462 at the upper portions of the respective branches 42 and 44 can be realized by NPN transistors, and the control elements 471 and 472 in the lower portion of the respective branches 42 and 44 can be realized by PNP transistors. The drive of the final control elements 461 and 471 ensues by means of respective drive signals U5 and U6 supplied across terminals 485 and 486.

In combination with diodes 56, constant current sources 54 prevent an overload of the driver amplifiers which supply the drive signal. The current which can be supplied by the constant current sources 54 must be selected so high that sufficient reserve is still present for driving the transistors 461, 462, 471 and 472, even given a maximum load current i. The diodes 58 limit the voltages of the driver amplifiers and, together with the diodes 56, avoid saturation of the transistors 461, 462, 471 and 472. It should also be noted that the individual transistors 461, 462, 471 and 472 can be replaced by Darlington circuits, or by parallel circuits consisting of a plurality of individual transistors.

Figure 4:
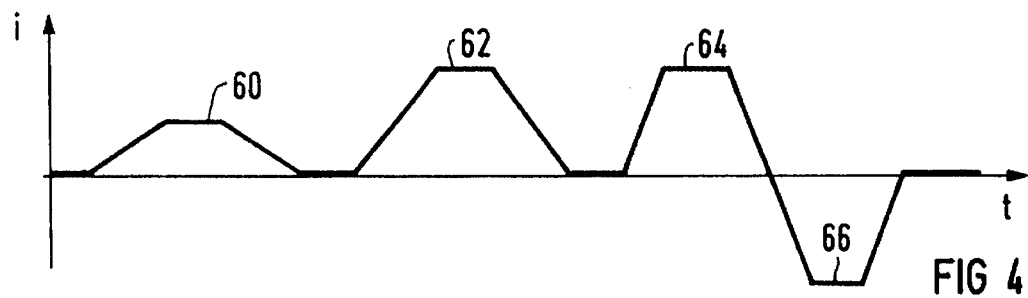
FIG. 4 shows the chronological curve of output current obtained in the voltage source constructed in accordance with the principles of the present invention.
Figure 5:
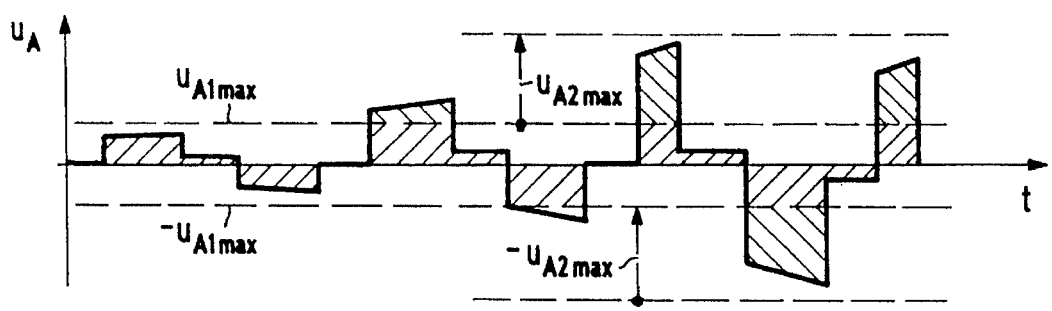
FIG. 5 shows the output voltage of the power supply given the current shown in FIG. 4.

The functioning of the current supply shall be set forth below with reference to the example of a pulse-shaped load current i, shown in FIG. 4. It will be assumed that the controlled voltage source 4 operates in basic load operation, and the controlled voltage source 6 operates in peak load operation. The load 2 is inductive with ohmic losses. The output voltage $u_A$ associated with the current i of FIG. 4 is shown in FIG. 5. The output voltage $u_A$ is proportional to the regulator output current $i_R$. Three positive current pulses 60, 62 and 64, having increasingly steep current edges, and a negative current pulse 66, are shown in FIG. 4. In the illustration of the output voltage $u_A$ in FIG. 5, the output voltage $u_{A1}$ supplied by the first voltage source 4 is diagonally hatched from the upper right toward the lower left, whereas the output voltage $u_{A2}$ supplied by the voltage source 6 is diagonally hatched from upper left to bottom right. The sum of the output voltages $u_{A1}$ and $u_{A2}$ yields the voltage $u_A$ at the load 2.

Figure 6:
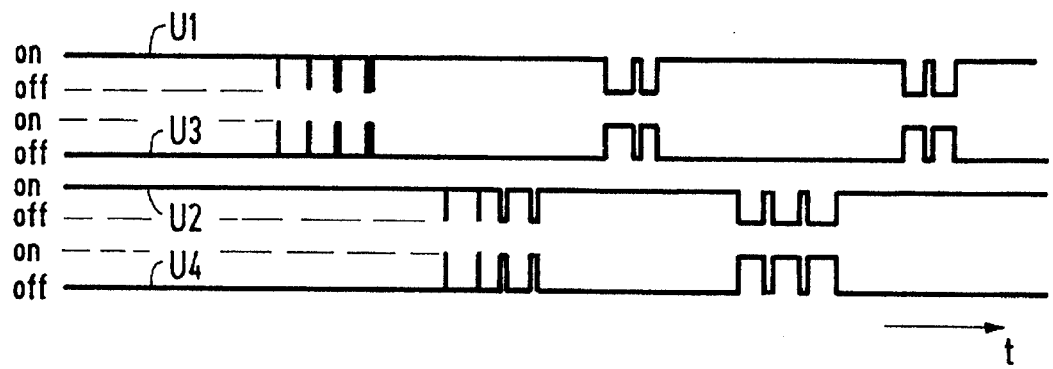
FIG. 6 shows exemplary drive signals for operating the voltage source in the embodiment of FIG. 2.

As an example, FIG. 6 shows the drive signals U1, U2, U3 and U4 at the respective control terminals 481, 482, 483 and 484 of the voltage source 6 of FIG. 2 operating in a switched mode, when it is intended to supply the current pulses shown in FIG. 4 to a prescribed load.

Figure 7:
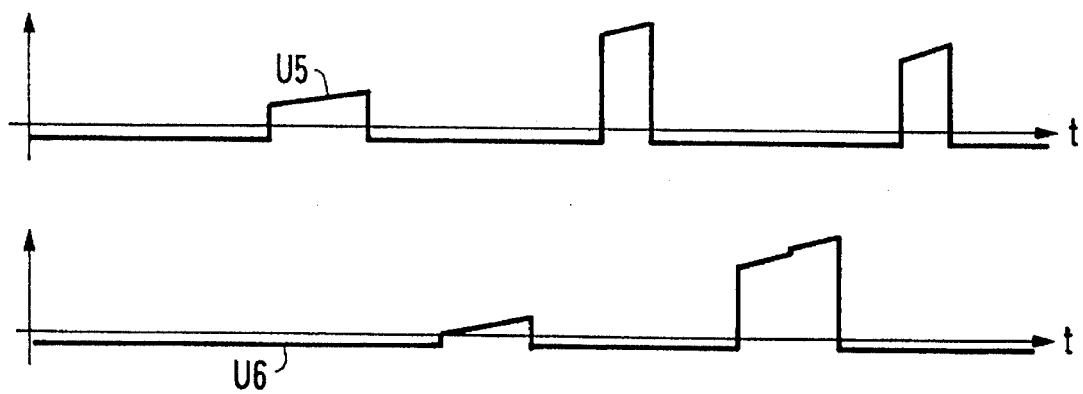
FIG. 7 shows exemplary drive signals for operating the voltage source in the embodiment of FIG. 3.
Figure 9:
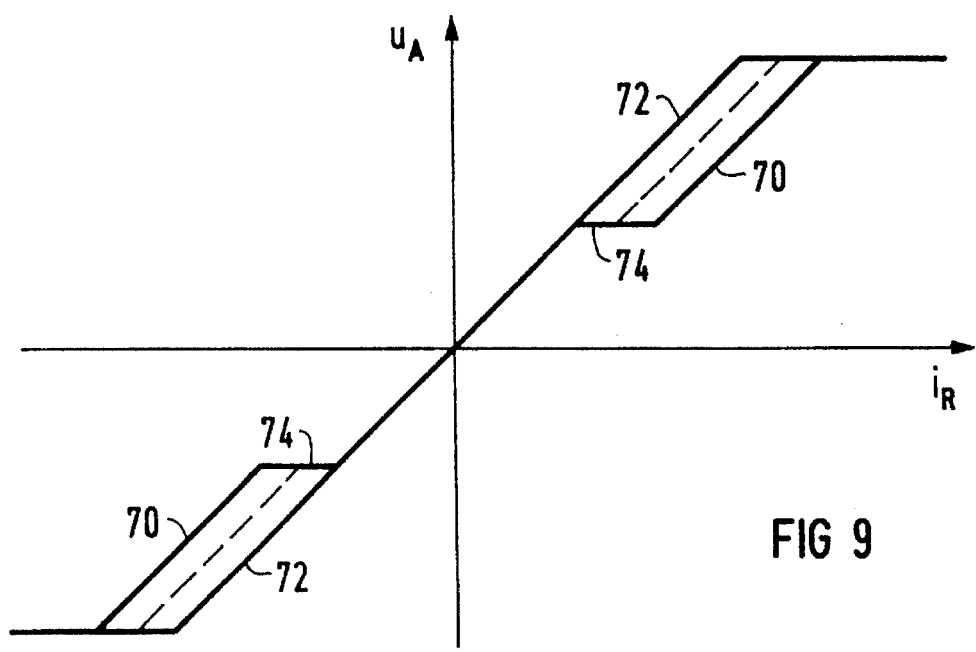
FIG. 9 illustrates a characteristic of a voltage source with different offset signals.

As an example, FIG. 7 shows the drive pulses U5 and U6 at the control terminals 485 and 486 of the voltage source 6 of FIG. 3 operating in a linear mode, when it is intended to supply the voltage pulses shown in FIG. 4, given a predetermined load.

The steepness of the first current pulse 60 is so slight that the output voltage $u_{A1}$ of the voltage source 4 suffices for generating the current pulse 60. The voltage source 6 is thereby switched to transmit, meaning that, given the voltage source 6 of FIG. 2, for example, the final control elements 461 and 462 are activated via the control terminals 481 and 482, whereas the control elements 471 and 472 are switched off via the control terminals 483 and 484. Given the voltage source 6 of FIG. 3, for example, the final control elements 461 and 462 are then activated, whereas the control elements 471 and 472 are inhibited. For that purpose, the drive voltages U5 and U6 at the control terminals 485 and 486 are negative. In this case, the amplitude must be so high that the control elements 471 and 472 do not become transmissive due to a voltage drop at the diodes 491 and 492 caused by the load current.

Given the voltage sources 6 of FIGS. 2 and 3, therefore, a current flow is enabled from the terminal 101 to the terminal 102 via the diode 491 and the final control element 462, or a current flow is enabled from the terminal 102 to the terminal 101 via the diode 492 and the control element 461. The dissipated power occurring in the semiconductor components arises from the on-state losses of the diodes which carry the load current, for example the diodes 491 or 492, and the final control element which is driven and which thus carries the load current, for example the final control element 462 or 461. It should be noted that, of course, it is possible the control elements 471 and 472 may be driven for transmitting, and the final control elements 461 and 462 may be inhibited for generating an output voltage of zero. The circuits of FIGS. 2 and 3 will then behave analogously to the above example.

The second current pulse 62 has edges which are steeper, so that both of the voltage sources 4 and 6 must be activated for generating the output current. The voltage source 4 is completely modulated; in addition, a modulation of the voltage source 6 ensues. The voltage source 6 of FIG. 2 supplies a positive output voltage $u_{A2}$ when the final control elements 461 and 471 are switched on and off in alternation in the form of a pulse-width modulation, whereby the average value of the output voltage $u_{A2}$ increases with increasing on-time duration of the final control-element 471, as shown in FIGS. 5 and 6. The final control element 462 continues to be activated and the final control element 472 continues to be deactivated. The voltage source 6 of FIG. 3 supplies an increasingly positive output voltage $u_{A2}$ when, as shown in FIG. 7, the drive voltage U5 becomes increasingly positive and the drive voltage U6 continuing negative.

At the pulse top, i.e., the horizontal part of the pulse 62, only the voltage source 4 is modulated, in order to cover the ohmic losses. The voltage source 6 continues to be switched to a transmitting state. Due to the necessary, negative voltage, the voltage source 4 is completely driven at the end of the current pulse 62; at which time an additional modulation of the voltage source 6 ensues. The voltage source 6 of FIG. 2 supplies a negative output voltage $u_{A2}$ when the final control elements 462 and 472 are switched on and off in alternation in the form of a pulse-width modulation, whereby the average value of the output voltage $u_{A2}$ becomes more negative with increasing on-time duration of the final control element 472, as shown in FIGS. 5 and 6. The control elements 461 is thereby activated and the control element 471 is deactivated.

The voltage source 6 of FIG. 3 generates an output voltage $u_{A2}$ which becomes increasing negative when, as shown in FIG. 7, the drive voltage U6 becomes increasingly positive, given a negative drive voltage U5.

For generating the current pulse 64, the voltage source 6 is substantially completely modulated, in addition to the voltage source 4. A reversal of the current at the load 2 is required for dismantling of the current pulse 64, for which purpose the voltage source 4 is completely modulated and the voltage source 6 is substantially completely modulated. The dismantling of the current pulse 64 steadily merges into the current generation of the negative current pulse 66, with the voltage for the pulse top of the pulse 66 being exclusively produced by negative voltage from the voltage source 4.

It can be recognized that the voltage provided by the voltage source 4 for basic load operation is adequate for generating current pulses having a slight steepness, as well as for covering the ohmic voltage drops. Only when a high voltage is needed for producing steeper current edges, which the voltage source 4 cannot produce by itself, is the voltage source 6 cut in. The voltage source 4 is, under those circumstances, completely modulated. The voltage source 6 is modulated only given a high voltage requirement.

It should be noted that the modulation can be expanded by the criterion of current direction and current amplitude, given the voltage source 6 of FIG. 2 operating in a switched mode. This means that the modulation ensues only at low currents, as shown. Given higher currents from the terminal 101 into the voltage source 6 and from terminal 102 proceeding from the voltage source 6, the final control elements 461 and 472 which have not been traversed by current are then switched off. Given higher currents in the opposite direction, the final control elements 462 and 471 which were not traversed by current are then switched off.

It should also be noted that an energy recovery by means of the free-running diodes 491 through 494 occurs in the voltage source 6 of FIG. 3 during current dismantling, under the conditions of the linearly operating voltage source 6 of FIG. 3 being completely driven and one of the drive voltages U5 or U6 then being negative and the other drive voltage being positive and higher than the voltage of the d.c. voltage source 18. The possibility of energy recovery in the voltage source 6 of FIG. 3 justifies the discharge elements 50 and 52 in the linearly operating voltage source 6.

Charging of the d.c. voltage sources 16 and 18 respectively connected to the voltage-setting units 12 and 14 can occur as a result of different switching times and safety times, and by different drive signals supplied to the units 12 and 14, as well as by current ramps which rise and fall with different steepnesses. In the simplest case, discharging of the voltage sources 4 and 6 caused by asymmetries is prevented by the first discharge element 50 shown in FIGS. 2 and 3. The discharge device 50 can be a resistor connected in parallel with the charging capacitors 41, and having a size dependent on the asymmetries in the curve of the current and on the ohmic losses in the load circuit. Fewer losses occur if the discharge element 50 is effective only as needed, or is remotely activatable, or is dependent on the voltage of the d.c. voltage source 16 or 18. A d.c.—d.c. converter may be employed as the discharge element 50 which distributes the energy arising due to charging to the d.c. voltage sources 16 or 18, and avoids the conversion of the energy into dissipated heat.

The second discharge element 52 may also be a resistor, connected in parallel to the output terminals. The discharge element 52 has the advantage that dissipated power therein will arise only when an output voltage $u_{A1}$ or $u_{A2}$ is present at the voltage source 4 or 6. Additionally, the discharge element 52 has the positive side-effect that the non-linearities produced by the on-state voltages, given an on-state drive, are reduced. If the discharge element 52 is an RC element, this will operate in combination with the voltage source 6 of FIG. 2 to dissipate power during the switching events. Such an RC element operating in combination with the voltage source 6 of FIG. 3, would dissipate power only due to a variation of the output voltage $u_{A2}$.

Figure 8:
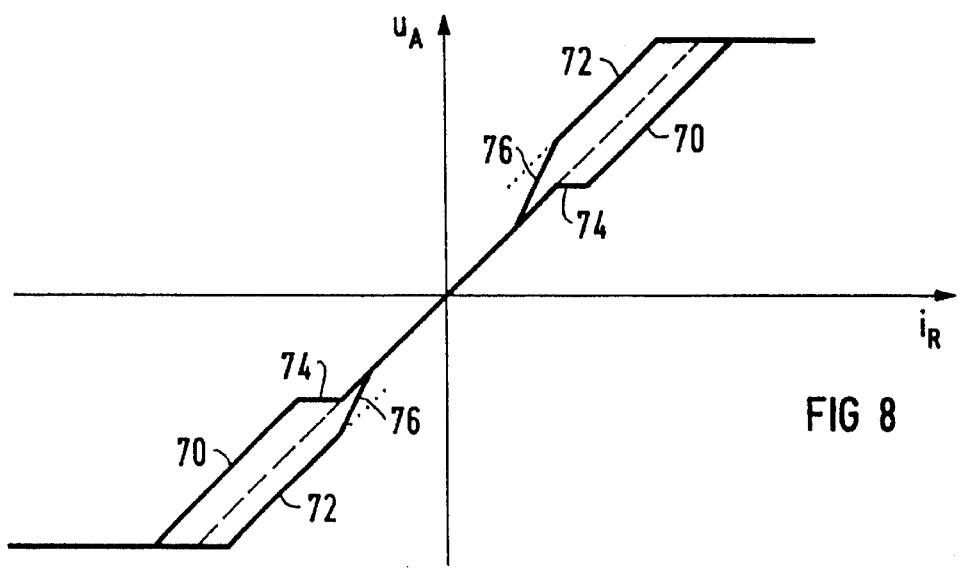
FIG. 8 illustrates a characteristic of the power supply constructed in accordance with the principles of the present invention when the voltage source for basic load operation is linearly operated and the voltage source for peak load operation is operated in a switched mode.

In the switched mode of the voltage-setting unit 14, the switching time for switching one of the final control elements on or off is lengthened, due to safety times which must be provided in the drive signal. The different current paths in the setting units 12 and 14 operating in the switched mode for the current generation, and during current dismantling, thus result in a hysteresis-like characteristic of the voltage source 6. If only voltage sources operating with voltage-setting units 12 and 14 in the switched mode are connected in series, no additional demands are made on the regulation, due to the overall, hysteresis-like characteristic of the current source. If, however, the voltage-setting unit 12 operates linearly, and the voltage-setting unit 14 operates in a switched mode, additional measures are needed for stabilizing the control circuit. This problem is discussed below in FIG. 8. It is assumed for the characteristics shown in FIGS. 8 through 12 that the controlled voltage source 4 for basic load operation is operated linearly, whereas the controlled voltage source 6 for peak load is operated in a switched mode. A hysteresis-like curve arises as shown in FIG. 8 for the upper part of the characteristic, whereby the branch 70 of the characteristic is the determining factor for the current generation, and the branch 72 of the characteristic is the determining factor for the current dismantling. A horizontal portion 74 of the characteristic arises during current generation due to the drive gaps, or due to the safety times. During current dismantling, both voltage setting units 12 and 14 are driven by counter-voltage in a region 76. The gain of the series circuits of the two voltage sources 4 and 6 is doubled, which can result in "hunting" in the control circuit in this operating region, given a modulation. The drive characteristic of the voltage source 6 can be shifted by a higher offset signal 34 such that the increase in the gain does not occur. This results, however, in a relatively large drive gap 74, as can be seen with in FIG. 9.

Figure 10:
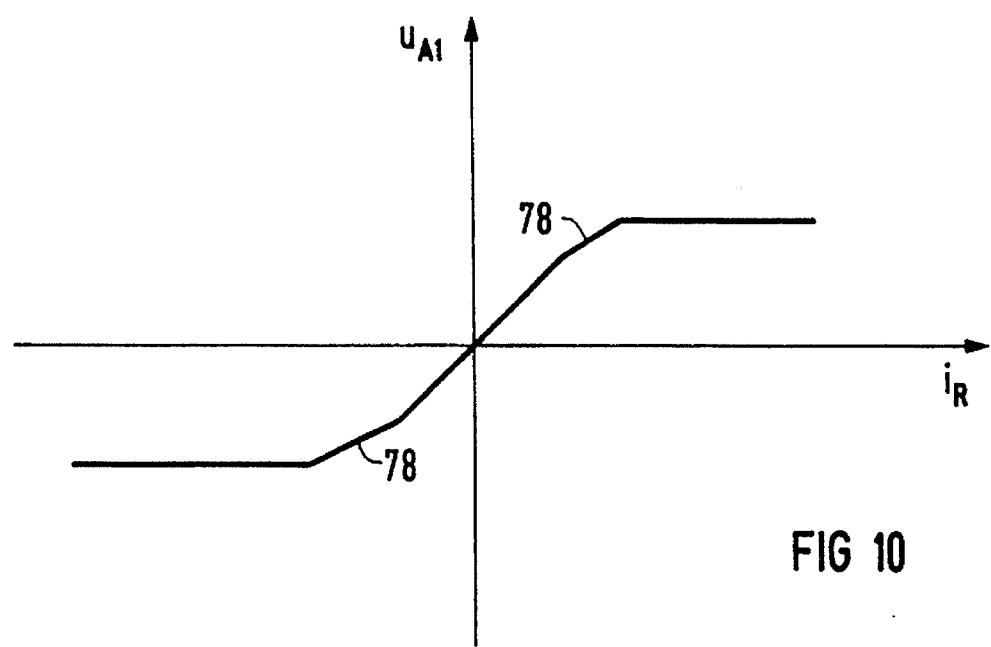
FIG. 10 illustrates a characteristic of the voltage source for basic load operation when linearly operated, with the gain being halved in the upper modulation range.
Figure 11:
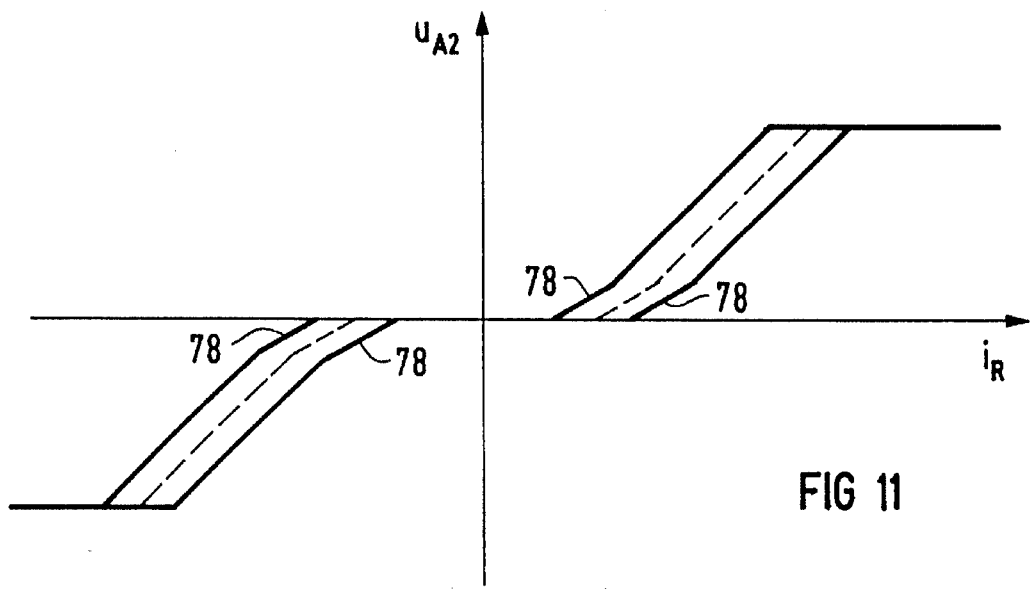
FIG. 11 illustrates a characteristic of a voltage source for peak load operation when operated in a switched mode, wherein the gain is halved in the lower modulation range.
Figure 12:
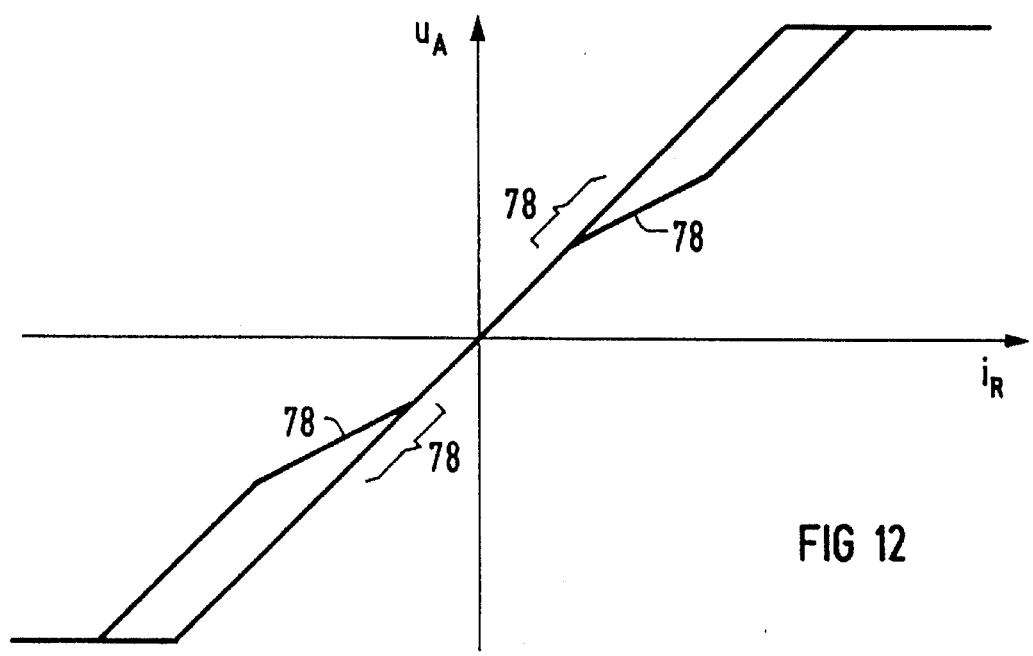
FIG. 12 illustrates a characteristic of a power supply formed by a combination of the voltage sources having the characteristics shown in FIGS. 10 and 11.

This drive gap 74 can be avoided by matching the characteristics set forth below with reference to FIGS. 10 through 12. FIG. 10 shows the characteristic of the basic load voltage source 4, whereby the gain in the characteristic is halved in the overlapping region 78, wherein a double gain could occur. Similarly, the gain is halved in the initial overlap region 78 in the characteristic of the voltage source 6 shown in FIG. 11. On the basis of an appropriate setting of the offset stage 32, the two characteristics can be combined such that the gain in the entire overlap region 78 amounts to at least half the gain which would otherwise be present, but is no more than the normal gain. The overall characteristic is shown in FIG. 12 as the sum of the individual characteristics, the unfavorable influence of the double gain and the zero gain, as occurs in the characteristic of FIG. 9, being compensated.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power supply for predominantly inductive loads comprising:

first controllable voltage source means for basic load operation for supplying a basic output voltage, and including a first voltage-setting unit having an input side connected to a first d.c. voltage source, said first voltage-setting unit having output terminals at which said basic output voltage is present;

second controllable voltage source means for peak load operation for supplying peak output voltages which exceed said basic output voltage, including a second voltage-setting unit having an input side connected to a second d.c. voltage source, said second voltage-setting unit having output terminals at which said peak output voltages are present; and said first and second d.c. voltage sources being connected separated in potential and the respective output terminals of said first and second voltage-setting units being connected in series.

2. A power supply as claimed in claim 1 further comprising means for switching said second voltage-setting unit at selected times for permitting unimpeded current passage therethrough for causing said peak output voltages to be zero.

3. A power supply as claimed in claim 1 further comprising at least one further controllable voltage source means for peak load operation for graduated supply of peak output voltages.

4. A power supply as claimed in claim 1 further comprising at least one further controllable voltage source means for peak load operation for operating in combination with said second controllable voltage source means, said second controllable voltage source means and said at least one further controllable voltage source means respectively supplying equal parts of said peak output voltages.

5. A power supply as claimed in claim 4 wherein said further voltage source means includes a further voltage-setting unit, and said power supply further comprising means for operating said second voltage-setting unit and said further voltage-setting unit in switched mode operation by pulse-width modulation with chronologically offset switching of said second voltage-setting unit and said further voltage-setting unit.

6. A power supply as claimed in claim 4 wherein said further voltage source means includes a further voltage-setting unit, and said power supply further comprising means for operating said second voltage-setting unit and said further voltage-setting unit in switched mode operation by pulse-width modulation with simultaneous switching of said second voltage-setting unit and said further voltage-setting unit.

7. A power supply as claimed in claim 1 wherein at least one of said first or second voltage-setting units includes two branches connected in parallel to the d.c. voltage source in the voltage source means containing said at least one voltage-setting unit, each branch consisting of two series-connected final control elements, and wherein the output terminals of said at least one voltage-setting unit are connected between the final control elements in each branch.

8. A power supply as claimed in claim 7 wherein said final control elements comprise switchable elements, and said power supply further comprising means for switching said final control elements with pulse-width modulation.

9. A power supply as claimed in claim 7 wherein said final control elements comprise linearly operating elements.

10. A power supply as claimed in claim 7 wherein each of said final control elements comprises at least one transistor.

11. A power supply as claimed in claim 7 wherein each of said final control elements comprises at least one free-running diode.

12. A power supply as claimed in claim 7 further comprising:

regulator means for generating a regulator output signal for switching said second controllable voltage source means to permit unimpeded current passage therethrough when said peak output voltage is to be zero;

means for generating a periodic delta signal; and wherein said means for switching said final control elements comprises modulator means for generating a pulse-width modulated control signal, supplied to said final control elements, dependent on said regulator output signal and said periodic delta signal.

13. A power supply as claimed in claim 12 further comprising means, preceding said modulator means, for charging said regulator output signal with at least one chronologically constant signal.

14. A power supply as claimed in claim 12 further comprising at least one matching amplifier means for matching said regulator output signal to said modulator means.

15. A power supply as claimed in claim 14 wherein said modulator means exhibits modulation limits, and wherein said matching amplifier means comprises an amplifier having a gain which is halved in the proximity of said modulation limits.

16. A power supply as claimed in claim 1 further comprising a discharge element connected in parallel with at least one of said first or second d.c. voltage sources.

17. A power supply as claimed in claim 1 further comprising a discharge element connected in parallel with the output terminals of at least one of said first or second voltage setting units.

18. A power supply as claimed in claim 1 wherein said load comprises a gradient coil of a nuclear magnetic resonance imaging apparatus, connected to said output terminals of said first and second voltage-setting units.

* * * * *